(12) United States Patent
Otremba et al.

(10) Patent No.: US 9,018,744 B2
(45) Date of Patent: Apr. 28, 2015

(54) SEMICONDUCTOR DEVICE HAVING A CLIP CONTACT

(71) Applicant: Infineon Technologies AG, Neubiberg (DE)

(72) Inventors: Ralf Otremba, Kaufbeuren (DE); Josef Hoeglauer, Kirchheim-Heimstetten (DE); Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/626,830

(22) Filed: Sep. 25, 2012

(65) Prior Publication Data

US 2014/0084433 A1  Mar. 27, 2014

(51) Int. Cl.

| | |
|---|---|
| *H01L 23/495* | (2006.01) |
| *H01L 23/34* | (2006.01) |
| *H01L 23/48* | (2006.01) |
| *H01L 23/52* | (2006.01) |
| *H01L 29/40* | (2006.01) |
| *H01L 21/44* | (2006.01) |
| *H01L 21/48* | (2006.01) |
| *H01L 21/50* | (2006.01) |
| *H01L 21/56* | (2006.01) |
| *H01L 23/498* | (2006.01) |
| *H01L 23/00* | (2006.01) |
| *H01L 23/31* | (2006.01) |

(52) U.S. Cl.
CPC .............. *H01L 21/56* (2013.01); *H01L 23/498* (2013.01); *H01L 24/34* (2013.01); *H01L 23/49541* (2013.01); *H01L 23/49562* (2013.01); *H01L 23/49575* (2013.01); *H01L 23/3107* (2013.01); *H01L 21/565* (2013.01); *H01L 2224/32245* (2013.01); *H01L 2224/48091* (2013.01); *H01L 2224/48247* (2013.01); *H01L 2224/73265* (2013.01); *H01L 2224/92247* (2013.01); *H01L 23/49524* (2013.01); *H01L 2224/73221* (2013.01); *H01L 2924/13055* (2013.01); *H01L 2924/13091* (2013.01)

USPC ........... 257/676; 257/712; 257/713; 257/717; 257/734; 257/784; 438/122; 438/123; 438/127; 438/617

(58) Field of Classification Search
USPC ......... 257/717, 720, 796, 712, 713, 734, 782, 257/783, 784, 666, 676; 438/122, 123, 124, 438/126, 127, 118, 617
See application file for complete search history.

(56) References Cited

U.S. PATENT DOCUMENTS

| | | | |
|---|---|---|---|
| 6,040,626 | A | 3/2000 | Cheah et al. |
| 7,084,488 | B2 | 8/2006 | Thornton et al. |
| 7,145,224 | B2 * | 12/2006 | Kawashima et al. ......... 257/678 |
| 7,271,470 | B1 | 9/2007 | Otremba |
| 7,295,453 | B2 | 11/2007 | Shiraishi et al. |

(Continued)

*Primary Examiner* — A. Sefer
*Assistant Examiner* — Dilinh Nguyen
(74) *Attorney, Agent, or Firm* — Slater & Matsil, L.L.P.

(57) ABSTRACT

A semiconductor device comprises a carrier. Further, the semiconductor devices comprises a semiconductor chip comprising a first main surface and a second main surface opposite to the first main surface, wherein a first electrode is arranged on the first main surface and the semiconductor chip is mounted on the carrier with the second main surface facing the carrier. Further, an encapsulation body embedding the semiconductor chip is provided. The semiconductor device further comprises a contact clip, wherein the contact clip is an integral part having a bond portion bonded to the first electrode and having a terminal portion forming an external terminal of the semiconductor device.

26 Claims, 5 Drawing Sheets

(56) References Cited

U.S. PATENT DOCUMENTS

| | | |
|---|---|---|
| 7,880,280 B2 | 2/2011 | Otremba |
| 8,058,107 B2 * | 11/2011 | Cruz et al. .................... 438/123 |
| 2005/0161785 A1 | 7/2005 | Kawashima et al. |
| 2007/0114352 A1 | 5/2007 | Cruz et al. |
| 2010/0127683 A1 | 5/2010 | Uno et al. |
| 2013/0049137 A1 * | 2/2013 | Uno et al. .................... 257/401 |

* cited by examiner

SEMICONDUCTOR DEVICE HAVING A CLIP CONTACT

TECHNICAL FIELD

This invention relates to the technique of packaging, and in particular to the technique of packaging a semiconductor chip using a clip contact.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated on wafers, which are then singulated to produce semiconductor chips. Subsequently, the semiconductor chips may be mounted on electrically conductive carriers, such as leadframes. Packaging methods providing small component sizes at low expenses are desirable.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing semiconductor chips are described herein. In particular, one or more semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure has electrodes on its two main surfaces, that is to say on its top side and bottom side.

In particular, power semiconductor chips may be involved. Power semiconductor chips may have a vertical structure. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on one main surface, while the drain electrode of the power MOSFET is arranged on the other main surface. The semiconductor chips need not be manufactured from specific semiconductor material, for example, Si, SiC, SiGe, GaAs, and, furthermore, may contain inorganic and/or organic materials that are not semiconductors. The semiconductor chips may be of different types and may be manufactured by different technologies.

The semiconductor chips may have electrodes which allow electrical contact to be made with the integrated circuits included in the semiconductor chips. The electrodes may include one or more metal layers which are applied to the semiconductor material of the semiconductor chips. The metal layers may be manufactured with any desired geometric shape and any desired material composition. The metal layers may, for example, be in the form of a layer or land covering an area. By way of example, any desired metal capable of forming a solder bond or diffusion solder bond, for example Cu, Ni, NiSn, Au, Ag, Pt, Pd, and an alloy of one or more of these metals may be used as the material. The metal layers need not be homogenous or manufactured from just one material, that is to say various compositions and concentrations of the materials contained in the metal layers are possible.

One or more semiconductor chips are mounted on a carrier. In one embodiment, the carrier may be a metal plate or sheet such as, e.g., a die pad of a leadframe. The metal plate or sheet may be made of any metal or metal alloy, e.g., copper or copper alloy. In other embodiments, the chip carrier may be made of plastics or ceramics. For instance, the chip carrier may comprise a layer of plastics coated with a metal layer. By way of example, such chip carrier may be a single-layer PCB or a multi-layer PCB. The PCB may have at least one insulating layer and a structured metal foil layer attached to the insulating layer. The insulating layer is typically made on the basis of epoxy resin, polythetrafluoroethylene, aramid fibers or carbon fibers and may include reinforcement means such as fiber mats, for example glass or carbon fibers. In other embodiments, the chip carrier may comprise a plate of ceramics coated with a metal layer. By way of example, such chip carrier may be DCB (direct copper bonded) ceramics substrate.

One or more power semiconductor chips are at least partly surrounded or embedded in at least one electrically insulating material. The electrically insulating material forms an encapsulation body. The encapsulation body may comprise or be made of a mold material. Various techniques may be employed to form the encapsulation body of the mold material, for example compression molding, injection molding, powder molding or liquid molding. Further, the encapsulation body may have the shape of a piece of a layer, e.g., a piece of a sheet or foil that is laminated on top of the power semiconductor chip(s) and the carrier(s). The encapsulation body may form part of the periphery of the package, i.e., may at least partly define the shape of the semiconductor device.

The electrically insulating material may comprise or be made of a thermoset material or a thermoplastic material. A thermoset material may e.g., be made on the basis of an epoxy resin. A thermoplastic material may e.g., comprise one or more materials of the group of polyetherimide (PEI), polyether-sulfone (PES) polyphenylene-sulfide (PPS) or polyamide-imide (PAI). Thermoplastic materials melt by application of pressure and heat during molding or lamination and (reversibly) harden upon cooling and pressure release.

The electrically insulating material forming the encapsulation body may comprise or be made of a polymer material. The electrically insulating material may comprise at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

In some embodiments, the electrically insulating material may be a laminate, e.g., a polymer foil or sheet. Heat and pressure may be applied for a time suitable to attach the polymer foil or sheet to the underlying structure. During lamination, the electrically insulating foil or sheet is capable of flowing (i.e., is in a plastic state), resulting in that gaps between the power semiconductor chips and/or other topological structures on the chip carriers are filled with the polymer material of the electrically insulating foil or sheet. The electrically insulating foil or sheet may comprise or be made of any appropriate thermoplastic or thermoset material. In one embodiment, the insulating foil or sheet may comprise or be made of a prepreg (short for pre-impregnated fibers), that is e.g., made of a combination of a fiber mat, for example glass or carbon fibers, and a resin, for example a thermoset or thermoplastic material. Prepreg materials are known in the art and are typically used to manufacture PCBs (printed circuit boards).

A contact clip is provided to electrically connect an electrode of the semiconductor chip to an external terminal of the semiconductor device. The contact clip may be an integral part having a bond portion bonded to the first electrode and having a terminal portion forming an external terminal of the semiconductor device. By way of example, the external terminal of the semiconductor device may comprise an external contact area exposed at the encapsulation body of a leadless package. The external terminal of the semiconductor device may also be a lead of a leaded package.

A variety of different types of electronic devices may be designed to use a contact clip as described herein or may be manufactured by the techniques described herein. By way of example, an electronic device in accordance with the disclosure may constitute a power supply containing two or more power MOSFETs and, optionally, one or more logic integrated circuits. For instance, an electronic device disclosed herein may comprise a half-bridge circuit including a high side transistor, a low side transistor and, optionally, a logic integrated circuit chip as a driver. A half-bride circuit which may e.g., be implemented in electronic circuits for converting DC voltages, so-called DC-DC converters. DC-DC converters may be used to convert a DC input voltage provided by a battery or rechargeable battery into a DC output voltage matched to the demands of electronic circuits connected downstream. By way of example, a DC-DC converter described herein may be a buck converter or down-converter.

Figure 1:
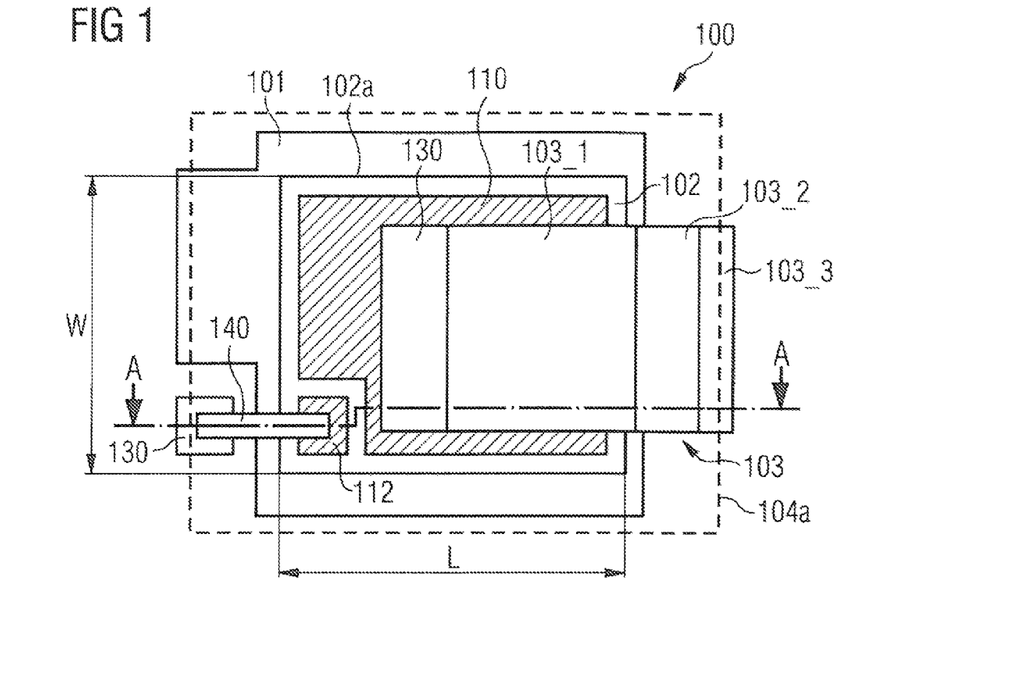
FIG. 1 schematically illustrates a top view of an embodiment of a semiconductor package with the encapsulation body assumed to be transparent for illustrative purposes.
Figure 2:
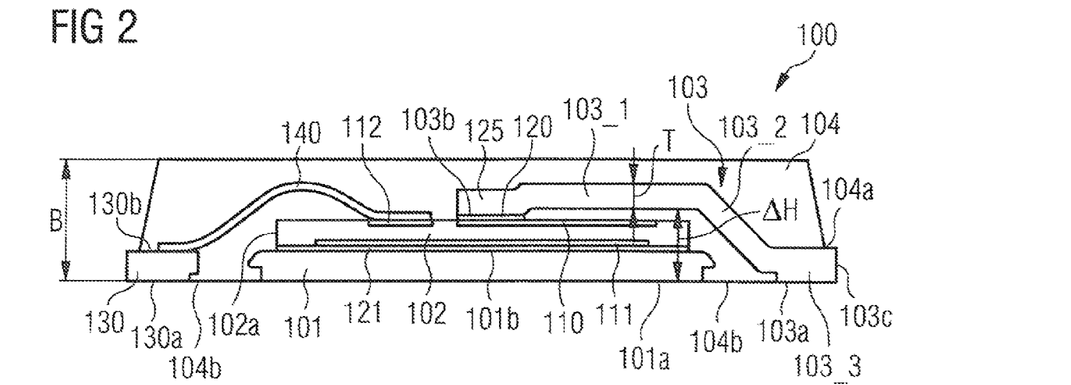
FIG. 2 schematically illustrates a cross-sectional view of the semiconductor package shown in FIG. 1 along line A-A.

FIG. 1 illustrates a top view of an exemplary semiconductor device 100 in accordance with one embodiment. The semiconductor device 100 may be a package comprising a carrier 101, a semiconductor chip 102, a contact clip 103 and an encapsulation body 104. FIG. 2 schematically illustrates a cross-sectional view of the semiconductor device 100 shown in FIG. 1 along section line A-A.

The carrier 101 may comprise or be made of a flat metal plate, e.g., a die pad of a leadframe. In other embodiments the carrier 101 may comprise or be made of a plastic plate or a ceramic substrate coated by a metal layer on the upper surface (i.e., the surface facing the semiconductor chip 102) thereof.

The semiconductor chip 102 may be mounted on the carrier 101 with its bottom surface facing the carrier 101 (e.g., die pad of a leadframe) and its top surface facing away from the carrier 101. The semiconductor chip 102 may have a first electrode (or contact pad) 110 on the top surface and a second electrode (or contact pad) 111 on the bottom surface. The first and second electrodes 110, 111 may be load electrodes of a power semiconductor chip 102. Furthermore, the semiconductor chip 102 may have a third electrode (or contact pad) 112 on its top surface. The third electrode 112 may e.g., be a control electrode of a power semiconductor chip 102.

The semiconductor chip 102 may be configured as a power transistor, for example, a power MOSFET, IGBT, JFET or power bipolar transistor, or a power diode. In the case of a power MOSFET or a JFET, a first electrode 110 is a source electrode, the second electrode 111 is a drain electrode, and the third electrode 112 is a gate electrode. In the case of an IGBT, the first electrode 110 is an emitter electrode, the second electrode 111 is a collector electrode, and the third electrode 112 is a gate electrode. In the case of a power bipolar transistor, the first electrode 110 is an emitter electrode, the second electrode 111 is a collector electrode, and the third electrode 12 is a base electrode. In the case of a power diode, the first and second electrodes 110, 111 are cathode and anode, respectively, and there is no third electrode. During operation, voltages higher than 5, 50, 100, 500 or 1000 V may be applied between the first and second electrodes 110, 111. The switching frequency applied to the third electrode 112 may be in the range from 1 kHz to 100 MHz, but may also be outside of this range.

The second electrode 111 may be electrically and mechanically coupled to the upper surface of the carrier 101 by a bond layer 121. The bond layer 121 may e.g., comprise or consist of solder, a soft solder, a diffusion solder, a paste, a nanopaste, or an electrically conductive adhesive.

More specifically, the bond layer 121 may e.g., be made of a diffusion soldering material such as e.g., AuSn, AgSn, CuSn, AgIn, AuIn, CuIn, AuSi, Sn or Au, or by a paste containing metal particles distributed in a polymer material or resin such as e.g., a-terpineol. Pastes containing metal particles can, for example, be purchased from the companies Coocson Electronic (product name: N 1000), Advanced Nano-Particles (ANP), Harima Chemicals (product names: NPS-H and NHD-1) or NBE Technologies (product name: NBE Tech). The metal particles may, for example, be made of silver, gold, copper, tin or nickel. The extensions (average diameter) of the metal particles may e.g., be smaller than 100 nm and, in particular, smaller than 50 nm or 10 nm. These pastes are also referred to as nanopastes in the art.

The first electrode 110 may be electrically and mechanically coupled to a bond portion 103_1 of the contact clip 103 by a bond layer 120. As to the bond layer 120, the same materials, substances and bonding techniques may be used as disclosed herein with reference to the bond layer 121.

The contact clip 103 further comprises a terminal portion 103_3 and an intermediate portion 103_2 extending between the bond portion 103_1 and the terminal portion 103_3. The bonding clip 103 is integral, i.e., the bond portion 103_1, the intermediate portion 103_2 and the terminal portion 103_3 may be made of one single part and/or do not have any assembly connections such as, e.g., solder bonds to interconnect the bond portion 103_1, the intermediate portion 103_2 and the terminal portion 103_3.

The bond portion 103_1 may comprise a depression 125 configured to provide for a bonding contact area 103b. The bonding contact area 103b may be slightly lowered in relation to the residual extension of the bond portion 103_1. The bonding contact area 103b may be bonded to the bond layer 120.

The bond portion 103_1 and the terminal portion 103_3 may run in a substantially parallel direction. The intermediate portion 103_2 may run substantially inclined or even perpendicular to the bond portion 103_1 and/or to the terminal portion 103_3.

The encapsulation body 104 of the semiconductor device 100 may embed the carrier 101 and the semiconductor chip 102 at side and top faces. The terminal portion 103_3 of the contact clip 103 forms an external terminal of the semiconductor device 100 and, therefore, protrudes out of the encapsulation body 104. By way of example, as illustrated in FIGS. 1 and 2, the semiconductor device may have a leadless package. In this and other cases the terminal portion 103_3 of the contact clip 103 may have an external contact area 103a exposed at the encapsulation body 104, e.g., at the bottom of the package. The external contact area 103a may be coplanar with a reference plane defined by a bottom surface 101a of the carrier 101. The bottom surface 101a of the carrier 101 may also be exposed at the bottom of the package. Further, a bottom surface portion 104b of the encapsulation body 104 may be coplanar with the reference plane defined by the bottom surface 101a of the carrier 101. In this case, the bottom surface 101a of the carrier, the bottom surface portion 104b of the encapsulation body 104 and the external contact area 103a of the terminal portion 103 may all be arranged substantially level with each other. They may form the bottom of the package.

A top surface 101b of the carrier 101 may define a reference plane of the package. This reference plane is referred to as an internal (package) reference plane. The internal reference plane may e.g., be coplanar with top surfaces of other supporting structures within the package such as, e.g., a top surface 130b of a lead post 130 and/or a top surface of another carrier (not shown) accommodated in the package of the semiconductor device 100. The contact clip 103 may intersect the internal reference plane at the intermediate portion 103_2. The intersection of the contact clip 103 with the internal reference plane may be situated within the encapsulation body 104, i.e., within the zone defined by the peripheral line 104a.

The lead post 130 may form another external terminal of the semiconductor device 100. A bottom surface 130a of the lead post 130 may be exposed at the bottom surface of the package of the semiconductor device 100 in order to e.g., provide for another SMT external contact area of the package.

The third electrode 112 may be coupled to the lead post 130 by an interconnect such as, e.g., a bond wire 140, another contact clip (not shown), etc. As may be seen from FIG. 2, the interconnect 140 may be completely accommodated in the package without having any external contact areas exposed at the package outside. The interconnect 140 may be connected to a top surface 130b of the lead post 130. The interconnect 140 may not intersect the internal reference plane of the semiconductor device 100 in case the top surface 130b of the lead post 130 is level with or above the internal reference plane.

The semiconductor device 100 may be a SMT (Surface Mounted Technology) package and/or a THT (Through-Hole Technology) package. In all cases the contact clip 103 is partly exposed at the encapsulation body 104 of the package. The contact area 103a of the terminal portion 103_3 of the contact clip 103 may be configured to be bonded to an application board such as, e.g., a PCB (Printed Circuit Board) of a customer's device.

Reference numeral 104a indicates a peripheral outline of the encapsulation body 104 at a lower edge of the encapsulation body 104. In FIG. 1 the encapsulation body 104 is assumed to be transparent in order to illustrate the internal structure of the package of the semiconductor device 100. As may be seen from FIGS. 1 and 2, a lateral end face 103c of the terminal portion 103_3 may be exposed at the periphery of the package of the semiconductor device 100. By way of example, the end face 103c of terminal portion 103_3 may protrude a small distance (e.g., less than 1 mm) over the peripheral line 104a of the encapsulation body 104. In other examples the end face 103c may be covered by encapsulation body 104 such that the encapsulation body 104 completely covers the lateral surfaces of the package.

The encapsulation body 104 may completely cover the top surface of the package. In other examples the encapsulation body 104 may have an opening (not shown) arranged over the contact clip 103. The opening may be used to couple the bond portion 103_1 of the contact clip 103 to a heat sink (not shown) disposed on top of the package of the semiconductor device 100.

The package of the semiconductor device 100 may also be a leaded package. In this case, the terminal portion 103_3 of the contact clip 103 is a lead protruding out of the package of the semiconductor device 100. In this case, no exposed contact area 103a situated at the bottom side of the package may not be provided. Rather, the bottom side of the package may exclusively be defined by the bottom surface 101a of the carrier 101 and the bottom surface 104b of the encapsulation body 104. The terminal portion 103_3 forming a terminal lead of the package may protrude out of the package over a distance greater than 1 mm, 3 mm, 5 mm, etc.

The package of the semiconductor device 100 may e.g., have a thickness (height) B in the range from about 0.5-2 mm, in particular about 1 mm. The semiconductor chip 102 may have a thickness (height) in the range from about 20, 50, 100 to about 200, 300, 500 μm. The carrier 101 may have a thickness (height) in the range from about 100-200 μm or even up to e.g., 500 μm. The interconnect 140, e.g., a bond wire, may have a diameter in the range from e.g., about 20-200 μm, in particular of about 50 μm. The semiconductor chip 102 may have a chip area of about 1-10 mm times 1-10 mm. By way of example, the length L of the semiconductor chip 102 may be about 5 mm or smaller and the width W of the semiconductor chip 102 may be about 6 mm or smaller.

The thickness (height) T of the contact clip 103 may e.g., be greater than 100 μm, 150 μm, 200 μm, 250 μm, 300 μm, and may e.g., be smaller than 200 μm, 300 μm or 500 μm. The difference in height ΔH overcome by the contact clip 103 (i.e., by the intermediate portion 103_2), may range from about 150 μm to 1000 μm and may e.g., be greater than 200 μm, 250 μm, 300 μm, 350 μm, or 400 μm. It is to be noted that the difference in height ΔH between the contact area 103a at the terminal portion 103_3 of the contact clip 103 and a lower surface of the bond portion 103_1 of the contact clip 103 is exclusively bridged by the integral contact clip 103 without any further parts of the package contributing to overcome this level difference ΔH.

FIGS. 3A-3E illustrate by way of example process stages of an embodiment of a method of packaging a semiconductor chip 102 to provide a semiconductor device such as e.g., semiconductor device 100 as shown in FIGS. 1 and 2. It is to be noted that the stages of production illustrated in FIGS. 3A-3E may be understood as simplifications, since further processes may be used which are not illustrated in these figures. For instance, further dielectric layers or structured metal layers may be applied during the assembly of the semiconductor device 100.

Figure 3A:
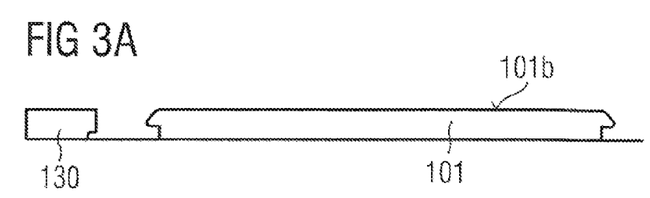
FIGS. 3A-3E schematically illustrate cross-sectional views of an exemplary process of a method of packaging a semiconductor chip.

According to FIG. 3A, the carrier 101 for the semiconductor chip 102 and, e.g., further support structures such as e.g., the lead post 130 are provided. The lead post 130 and the carrier 101 may form part of the same leadframe.

The carrier 101 may e.g., be a die pad of a leadframe, a PCB (Printed Circuit Board), a DCB (Direct Copper Bond), which is a ceramic substrate with copper layers on its top and bottom surface, etc. The carrier 101 is made of or has the top surface 101b be made of any desired metal. In particular, metals capable of forming a diffusion solder bond, for example Cu, Ni, NiSn, Au, Ag, Pt, Pd, or an alloy of one or more of these metals, may be used.

The bond layer 121 of solder material or any other electrically and mechanically bonding substance such as e.g., a conducting adhesive may then be applied to the top surface 101b of the carrier 101. By way of example, the bond layer 121 may be deposited by using a sputtering process, an electrochemical deposition process, a printing or a dispensing process. By way of example, a solder material paste may be printed or dispensed on the top surface 101b of the carrier 101. The solder material paste may contain metal particles, e.g., a flux material and e.g., an organic solvent known in the art to be used to separate the metal particles.

In particular, any solder material capable of forming diffusion solder bonds may be used, for example solder material comprising one or more of Sn, SnAg, SnAu, In, InAg, and InAu. The solder material may be free of Pb. If the solder material is a diffusion solder material paste, it may e.g., comprise metal particles made e.g., of one or more of the above cited materials.

Figure 3B:
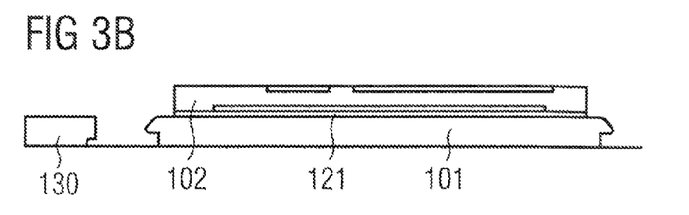

FIG. 3B schematically illustrates the process of placing the semiconductor chip 102 on the carrier 101 with the second main surface facing the carrier 101. The bond layer 121 is arranged between the second main surface of the semiconductor chip 102 and the top surface 101b of the carrier 101. The second chip electrode 111 may be arranged opposite to and in abutment with the bond layer 121.

The semiconductor chip 102 may then be bonded to the carrier 101. By way of example, if the bond layer 121 comprises a solder material, the arrangement shown in FIG. 3B may be heated to a temperature in order to attach the semiconductor chip 102 to the carrier 101 firmly. Heating may be accomplished e.g., in a furnace. In other examples, the semiconductor chip 102 may merely be placed on the bond layer 121 and the attachment of the semiconductor chip 102 to the carrier 101 is performed later at the process stage shown in FIG. 3E.

Figure 3C:
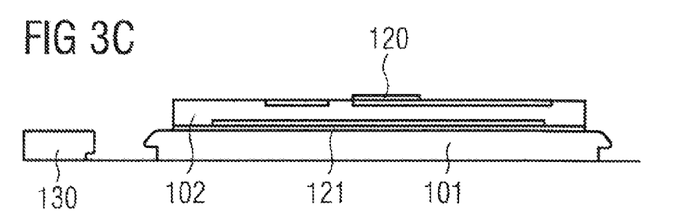

Then, with reference to FIG. 3C, the bond layer 120 may be deposited on the first electrode 110 at the first main surface of the semiconductor chip 102. The material of the bond layer 120 may be identical to the material of the bond layer 121 as described above. Further, the same processes of application as described with reference to bond layer 121 may be used to deposit bond layer 120 on the semiconductor chip 102.

Figure 3D:
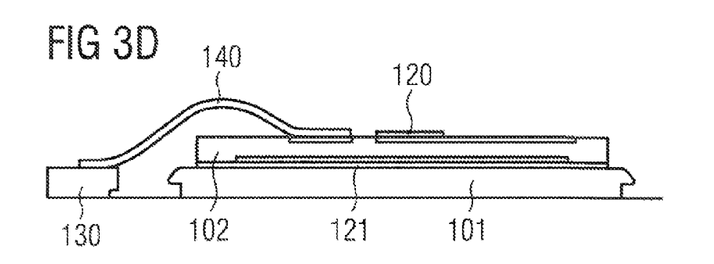

Referring to FIG. 3D, the interconnect 140 may be bonded to the third electrode 112 and the top surface 130b of the lead post 130 in order to electrically connect the semiconductor chip 101 to the bottom surface 130a of the lead post 130 representing an external terminal of the semiconductor device 100. The bonding of the interconnect 140 may also be done at another stage of the manufacturing process, e.g., before the process of applying the bond layer 120 or after the process of applying the contact clip 103 as shown in FIG. 3E.

Figure 3E:
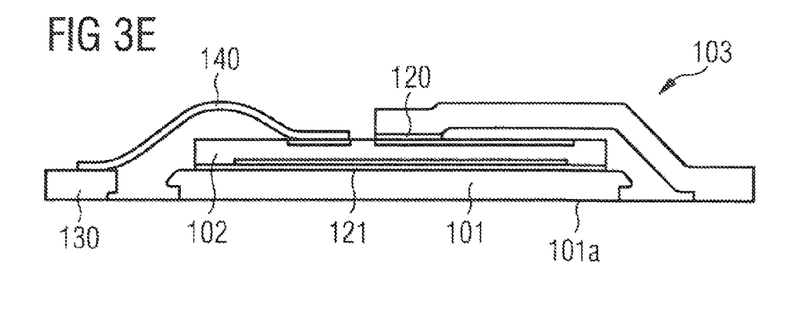

In FIG. 3E the contact clip 103 is placed over the semiconductor chip 102. The contact clip 103 may be made of any desired metal, e.g., of a metal capable of forming a diffusion solder bond, for example, Cu, Ni, NiSn, Au, Ag, Pt, Pd, or any alloy of one or more of these metals.

The contact clip 103 forms an external terminal of a semiconductor device 100. By way of example, the contact clip 103 may be part of a leadframe referred to as a contact clip leadframe. The contact clip leadframe may be a second leadframe, i.e., a leadframe which is different to the first leadframe comprising the carrier (or chip pad) 101 and the lead post 130. One possibility of placing the contact clip 103 on the arrangement shown in FIG. 3C or 3D is to bring the second leadframe ("contact clip leadframe") in alignment with the first leadframe ("chip carrier leadframe"). In this case, the frames (not shown) of the two leadframes may both be positioned at the same level, e.g., at the level given by the peripheral or bottom reference plane defined by the bottom surface 101a of the carrier 101.

The process of using two leadframes for obtaining the structure shown in FIG. 3E is an example of a parallel process for placement of the contact clip(s) 103. It is also possible to place the contact clip(s) 103 on the arrangement shown in FIG. 3C or 3D in a sequential process, i.e., clip-by-clip for each semiconductor device 100.

The contact clip 103 may then be bonded to the carrier 101. By way of example, if the bond layer 121 comprises a solder material, the arrangement shown in FIG. 3E may be heated to a temperature in order to attach the contact clip 103 to the semiconductor chip 102 firmly. Heating may be accomplished e.g., in a furnace. In some examples, as mentioned above, the process of bonding the semiconductor chip 102 to the carrier 101 and the process of bonding the contact clip 103 to the semiconductor chip 101 may be performed concurrently.

An electrically insulating material may then be applied to form the encapsulation body 104, see FIG. 2. The electrically insulating material may e.g., be applied by using molding techniques as described before.

The electrically insulating material may e.g., be applied by using lamination techniques as described before.

Figure 4:
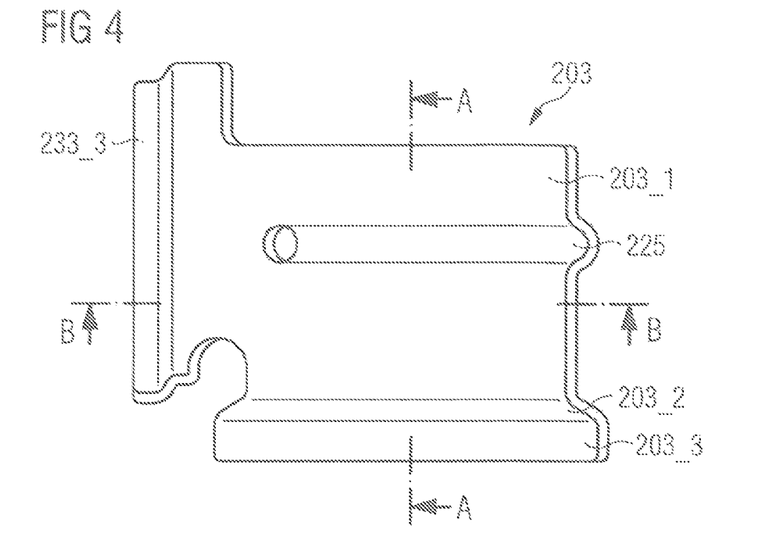
FIG. 4 schematically illustrates a perspective view of a contact clip having a plurality of edge contact portions in accordance with several embodiments.

FIG. 4 illustrates a perspective view of an exemplary contact clip 203. The contact clip 203 may be identical to contact clip 103 in accordance with the above disclosure. In particular, contact clip 203 may comprise or be made of the same material as described above. Thus, in order to avoid reiteration, reference is made to the above disclosure to contact clip 103.

Contact clip 203 comprises a bond portion 203_1 which may be equipped with a depression 225 corresponding to the bond portion 103_1 of the contact clip 103 described above. The contact clip 203 may further comprises an intermediate portion 203_2 and a terminal portion 203_3 corresponding to the intermediate portion 103_2 and terminal portion 103_3 of the contact clip 103 described above. All disclosures described herein with reference to contact clip 101 may also apply to contact clip 203.

The terminal portion 203_3 forms a first lateral edge of the contact clip 203. The first lateral edge is configured to form an external terminal of a package (such as the package shown in FIGS. 1 and 2 or the package shown further below in FIGS. 7-9) accommodating the contact clip 203.

Figure 5:
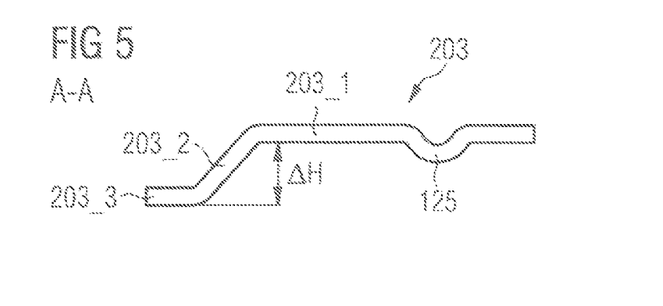
FIG. 5 illustrates a cross-sectional view of the contact clip shown in FIG. 1 along line A-A.

A cross-sectional view of the contact clip 203 along line A-A is shown by way of example in FIG. 5. The cross-sectional shape of contact clip 203 may be similar or identical to the cross-sectional shape of contact clip 103 as shown in FIG. 2. In particular, the same level difference ΔH may be bridged by the intermediate portion 203_2 of contact clip 203.

The contact clip 203 may have a second portion 233_3 comprising a second lateral edge of the contact clip. The second lateral edge may be orientated substantially perpendicular to the first lateral edge.

Figure 6A:
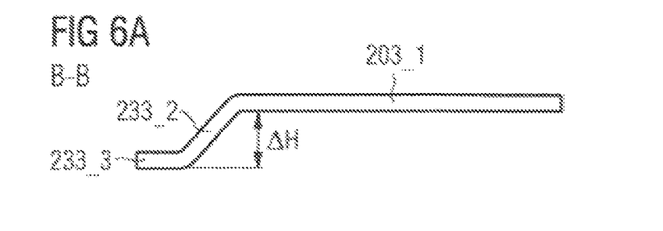
FIGS. 6A-6B illustrate cross-sectional views of the contact clip shown in FIG. 1 along line B-B in accordance with several embodiments.

In accordance with one example, the second portion 233_3 may be designed similar or identical to the first portion 203_3. Thus, the same level difference ΔH may be bridged by an intermediate portion 233_2 interconnecting the second portion 233_3 with the bond portion 203_1. In this case, the second portion 233_3 may form an external terminal of a package, e.g., a SMT package as explained above. By way of example, FIG. 6A illustrates a cross-sectional view of a contact clip 203 along line B-B in accordance with this contact clip design.

Figure 6B:
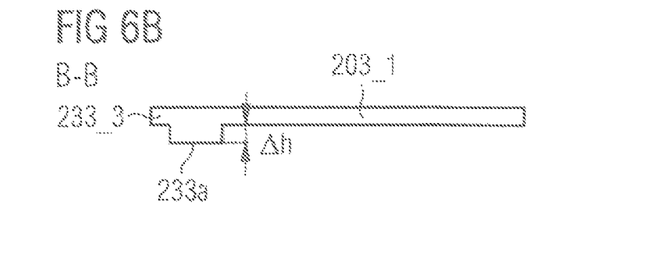

Alternatively, contact clip 203 may be designed to show a cross-sectional shape along line B-B in accordance with FIG. 6B. In this case, the second portion 233_3 comprising the second lateral edge of the contact clip 203 does not form an external terminal of the contact clip 203. Rather, the second portion 233_3 of contact clip 203 may extend at the same level as the bond portion 203_1 and/or may have a downward protrusion comprising a contact area 233a. Contact area 233a is a contact area to form a contact to an internal structure of the package in which the contact clip 203 is (intended to be) used. The difference in height Δh between the contact area 233a and a bottom surface of the bond portion 203_1 of the contact clip 203 is significantly smaller than ΔH. That is, in this example, the second lateral edge 233_3 and the first lateral edge 203_3 of the contact clip 203 are arranged on different levels relative to the bond portion 203_1 of the contact clip 203. When implemented in a package (see e.g., FIG. 7), the second lateral edge 233_3 and the first lateral edge 203_3 are arranged on different levels relative to a bottom plane of the package (which may be defined by the bottom surface 101a of the carrier 101 as illustrated in FIGS. 1-3E).

In other words, in accordance with one example, contact clip 203 may have two or more lateral edges serving as external terminals of a package in which the contact clip 203 is used. Further, in accordance with one example, the contact clip 203 may have at least one lateral edge serving as an external terminal of the package in which the contact clip 203 is used and may have at least one (other) lateral edge serving as an internal contact within the package in which the contact clip 203 is used.

Figure 7:
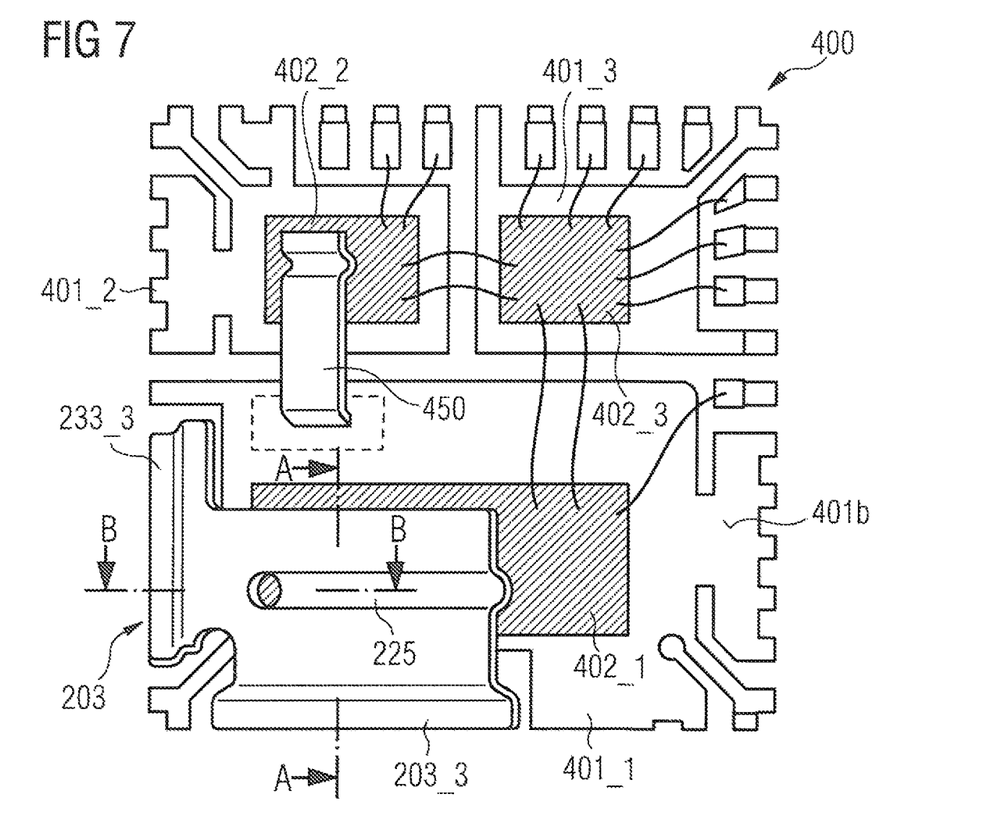
FIG. 7 schematically illustrates a top view of an embodiment of a semiconductor package using a contact clip having a plurality of edge contact portions.

FIG. 7 schematically illustrates a top view of an embodiment of a semiconductor device 400 employing a contact clip 203 having two edge contact portions as described above. The semiconductor device 400 may comprise a first carrier 401_1, a second carrier 401_2 and a third carrier 401_3. All carriers 401_1, 401_2 and 401_3 may level with each other. All carriers 401_1, 401_2 and 401_3 may be die pads of one leadframe.

The semiconductor device 400 may be a multi-chip device. By way of example, the semiconductor device 400 may be a DC-DC converter. The semiconductor device 400 may comprise a first semiconductor chip 402_1, a second semiconductor chip 402_2 and third semiconductor chip 402_3. The first and second semiconductor chips 402_1, 402_2 may be power semiconductor chips such as, e.g., power MOSFETs. The third semiconductor chip 402_3 may e.g., be a logic integrated circuit (IC) configured to control the power semiconductor chips 402_1, 402_2. DC-DC converters may be used to convert a DC input voltage provided by a battery or rechargeable battery into a DC output voltage matched to the demands of electronic circuits connected downstream.

In FIG. 7, a so-called half-bridge circuitry is depicted. The first semiconductor chip 402_1 may form the low side power switch and the second semiconductor chip 402_2 may form the high side power switch of the half-bridge. The logic integrated circuit 403_1 controls gate electrodes of the low side and high side power semiconductor chips 402_1 and 402_2, respectively. The source electrode of the high side power semiconductor chip 402_2 is connected to the first carrier 401_1 by a contact clip 405. The contact clip 405 may be a conventional contact clip which bridges a level difference Δh as, by way of example, exemplified in FIG. 6B. That is, the contact clip 450 may reach down to the internal reference plane of the package defined by the top surface 401b of the first carrier 401_1 (corresponding to the top surface 101b of the carrier 101 illustrated in FIGS. 1-3). That way, the source electrode of the high side power semiconductor chip 402_2 is electrically connected to the drain electrode of the low side power semiconductor chip 402_1.

A contact clip 203, as illustrated by way of example in FIGS. 4, 5 and FIG. 6A or FIG. 6B, is employed in the semiconductor device 400. The contact clip 203 may contact the source electrode of the low side power semiconductor chip 402_1 and provide for external terminal(s) of the package.

Figure 8A:
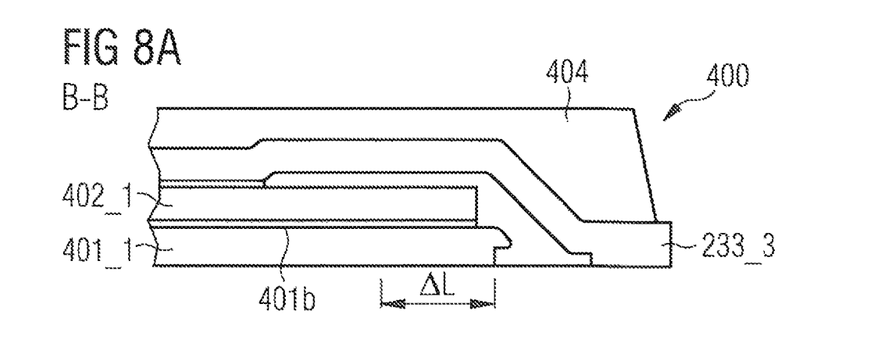
FIGS. 8A-8B illustrate cross-sectional views of the contact clip shown in FIG. 7 along line B-B in accordance with several embodiments.
Figure 9:
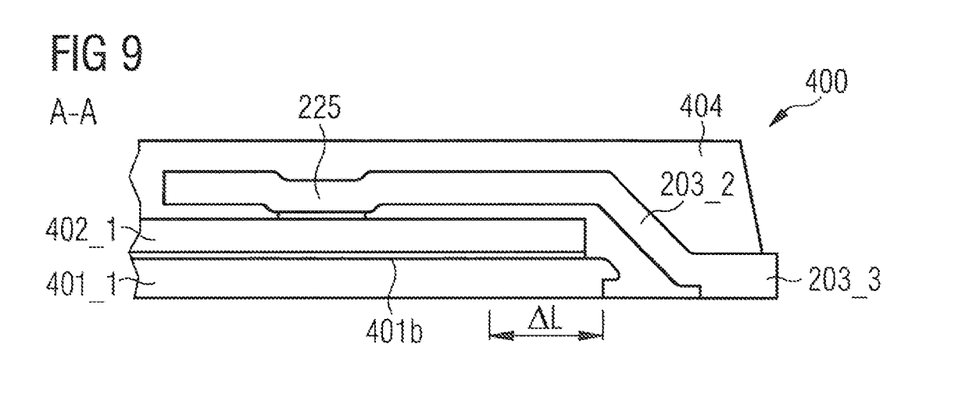
FIG. 9 illustrates a cross-sectional view of the contact clip shown in FIG. 7 along line A-A.

In one example, the contact clip 203 may be designed in accordance with the disclosure of FIGS. 4, 5 and 6A. Such implementation is illustrated in FIGS. 7, 8A and 9. In this case, both the first lateral edge 203_3 and the second lateral edge 233_3 of the contact clip 203 are configured to form external terminals of the package.

In another example, the contact clip 203 may be designed as illustrated in FIGS. 4, 5 and 6B. In this case, the second lateral edge 233_3 of the contact clip 203 does not form an external terminal of the package. Rather, as may be seen in FIG. 8B, the lateral edge 233_3 of the contact clip 203 may contact a terminal 460. The terminal 460 forms an external terminal of the package similar to the terminal portion 103_3 of the contact clip 103. However, the terminal 460 is connected to the contact clip 203 by a bond layer 461, i.e., is not integral with the contact clip 203. Further, the second lateral edge portion 233_3 of the contact clip 203 may merely reach down to a level above the internal reference plane of the package defined by the top surface 401b of the first carrier 401_1 (corresponding to the top surface 101b of the carrier 101 as described further above).

Figure 8B:
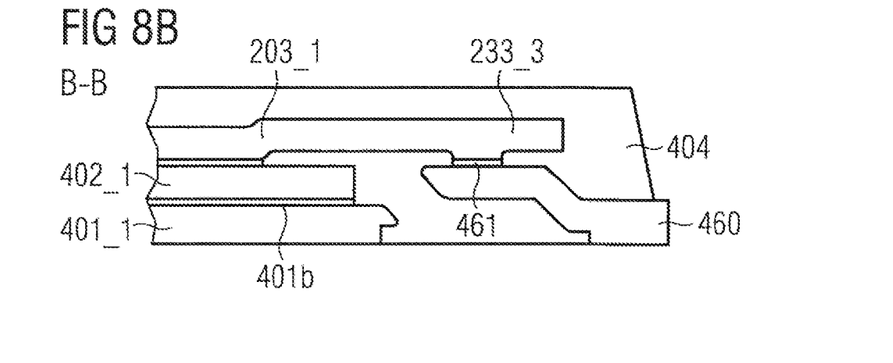

Comparing FIG. 8A with FIG. 8B, it is apparent that the integral contact clip and external terminal design of FIG. 8A is less space consuming in a lateral direction than the two-part contact clip and external terminal design shown in FIG. 8B. By way of example, assuming a given size of the package, the chip area may be increased by ΔL in the lateral direction when using the integral contact clip and external terminal design of FIG. 8A. Or, assuming a given chip area, the lateral dimension of the package may be decreased in the same amount when using the integral contact clip and external terminal design of FIG. 8A. Therefore, the integral contact clip and external terminal designs as describe herein may promote package miniaturization and/or increase of chip area. Further, bond layers as exemplified by bond layer 461 in FIG. 8B may no longer be needed when using the integral contact clip and external terminal design as disclosed herein.

FIG. 9 illustrates a sectional view along line A-A in FIG. 7. As described before in relation with FIGS. 1-5, the first lateral edge 203_3 of contact clip 203 is used as an external terminal of the package of the semiconductor device 400. As may e.g., be seen in FIGS. 8A, 8B and 9, the package of semiconductor device 400 may comprise an encapsulation body 404 having the same characteristics as described herein with reference to encapsulation body 104.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. By way of example, the first electrical interconnect 131 may e.g., be a bonding wire in some embodiments. Therefore, it is intended that this invention be limited only by the claims and the equivalents thereof.

What is claimed is:

1. A semiconductor device, comprising:
   a carrier;
   a semiconductor chip comprising a first main surface and a second main surface opposite to the first main surface, wherein a first electrode is arranged on the first main surface and the semiconductor chip is mounted on the carrier with the second main surface facing the carrier;
   an encapsulation body embedding the semiconductor chip; and
   a contact clip, wherein the contact clip is an integral part comprising:
      a bond portion bonded to the first electrode;
      a first terminal portion forming a first part of an external terminal of the semiconductor device, wherein the first terminal portion comprises an external contact area exposed at the encapsulation body;
      a first intermediate portion extending between the bond portion and the first terminal portion and overcoming a difference in height between the bond portion and the first terminal portion;
      a second terminal portion forming a second part of the external terminal of the semiconductor device, wherein the second terminal portion comprises an external contact area exposed at the encapsulation body, and wherein the external contact area of the first terminal portion and the external contact area of the second terminal portion extend substantially perpendicular to each other; and
      a second intermediate portion extending between the bond portion and the second terminal portion and overcoming a difference in height between the bond portion and the second terminal portion, wherein the first intermediate portion and the second intermediate portion extend substantially perpendicular to each other in projection onto a bottom reference plane defined by a bottom surface of the carrier.

2. The semiconductor device of claim 1, wherein the semiconductor chip is a power semiconductor chip.

3. The semiconductor device of claim 1, wherein a second electrode is arranged on the second main surface of the semiconductor chip.

4. The semiconductor device of claim 1, wherein the contact clip intersects an internal reference plane defined by a top surface of the carrier.

5. The semiconductor device of claim 1, wherein the external contact area of the contact clip is substantially coplanar with the bottom reference plane.

6. The semiconductor device of claim 1, wherein a bottom surface of the encapsulation body is substantially coplanar with the bottom reference plane.

7. The semiconductor device of claim 1, wherein the bond portion bonded to the first electrode and the external contact area of the first terminal portion exposed at the encapsulation body are substantially in parallel with each other.

8. The semiconductor device of claim 1, wherein the first and second intermediate portions extend substantially inclined or perpendicular to the bond portion.

9. The semiconductor device of claim 1, wherein the external contact area of the terminal portion is a leadless package contact area.

10. The semiconductor device of claim 1, wherein the first terminal portion is a lead of a leaded package.

11. The semiconductor device of claim 1, wherein the carrier is a die pad of a leadframe.

12. A contact clip configured to electrically contact an electrode of a semiconductor chip within a package, the contact clip comprising:
   a bond portion configured to be bonded to the electrode of the semiconductor chip;
   a first terminal portion configured to form a first external contact of the package, wherein the first terminal portion comprises the first external contact exposed at an encapsulation body;
   a first intermediate portion extending between the bond portion and the first terminal portion and overcoming a difference in height between the portions;
   a second terminal portion configured to form a second external contact of the package, wherein the second terminal portion comprises the second external contact exposed at the encapsulation body, and wherein the first and second external contacts extend substantially perpendicular to each other; and
   a second intermediate portion extending between the bond portion and the second terminal portion and overcoming a difference in height between the portions, wherein the first intermediate portion and the second intermediate portion extend substantially perpendicular to each other in projection onto a bottom reference plane defined by a bottom surface of a carrier.

13. The contact clip of claim 12, wherein the first external contact and the second external contact are arranged on the same level relative to the bond portion.

14. The contact clip of claim 12, wherein the first intermediate portion extending substantially inclined or perpendicular to at least one of the bond portion and the first terminal portion.

15. The contact clip of claim 12, wherein the first external contact is a leadless package contact.

16. The contact clip of claim 12, wherein the first terminal portion is a lead of a leaded package.

17. The contact clip of claim 12, wherein the semiconductor chip is a vertical power semiconductor chip.

18. A contact clip configured to electrically contact an electrode of a semiconductor chip within a package, the contact clip comprising:
a bond portion configured to be bonded to the electrode of the semiconductor chip;
a first portion comprising a first lateral edge of the contact clip and being configured to form an external terminal of the package, wherein the external terminal comprises an external contact area exposed at an encapsulation body;
an intermediate portion interconnecting the bond portion to the first portion, the intermediate portion extending substantially inclined or perpendicular to at least one of the bond portion and the first portion and intersecting an internal reference plane defined by a top surface of a carrier; and
a second portion comprising a second lateral edge of the contact clip, the second lateral edge comprising a contact area configured to form a contact to an internal structure of the package, wherein the second portion is distinct from the intermediate portion, and wherein the second portion does not intersect the internal reference plane.

19. The contact clip of claim 18, wherein the first lateral edge and the second lateral edge extend substantially perpendicular to each other.

20. The contact clip of claim 18, wherein the first lateral edge and the second lateral edge are arranged on different levels relative to a bottom plane of the package.

21. A method of manufacturing a semiconductor device, the method comprising:
providing a semiconductor chip comprising a first main surface and a second main surface opposite to the first main surface, wherein a first electrode is arranged on the first main surface;
mounting the semiconductor chip on a carrier, wherein the semiconductor chip is mounted on the carrier with the second main surface facing the carrier;
bonding a contact clip to the semiconductor chip, wherein the contact clip is an integral part having a bond portion bonded to the first electrode, a first terminal portion, a first intermediate portion extending between the bond portion and the first terminal portion and overcoming a difference in height between the bond portion and the first terminal portion, a second terminal portion, and a second intermediate portion extending between the bond portion and the second terminal portion and overcoming a difference in height between the bond portion and the second terminal portion, wherein the first intermediate portion and the second intermediate portion extend substantially perpendicular to each other; and
forming an encapsulation body embedding the semiconductor chip, wherein the first terminal portion forms a first external terminal exposed at the encapsulation body and the second terminal portion forms a second external terminal exposed at the encapsulation body, and wherein the first external terminal is arranged on a first edge of the encapsulation body and the second external terminal is arranged on a second edge of the encapsulation body perpendicular to the first edge.

22. The method of claim 21, further comprising:
bonding a bonding wire to a second electrode arranged on the first main surface of the semiconductor chip.

23. The method of claim 21, wherein the carrier is a die pad of a first leadframe and the contact clip is part of a second leadframe, comprising:
aligning the first leadframe and the second leadframe when bonding the contact clip to the semiconductor chip.

24. A semiconductor device comprising:
a first power semiconductor chip mounted on a first die pad of a carrier;
a second power semiconductor chip mounted on a second die pad of the carrier;
a first contact clip interconnecting an electrode on a top surface of the first power semiconductor chip to the second die pad, wherein the first contact clip is distinct from the second die pad; and
a second contact clip being an integral part having a bond portion bonded to an electrode on a top surface of the second power semiconductor chip and having a first terminal portion forming a first external terminal of the semiconductor device and a second terminal portion forming a second external terminal of the semiconductor device, wherein the first external terminal is exposed at a first edge of an encapsulation body and the second external terminal is exposed at a second edge of the encapsulation body perpendicular to the first edge.

25. The semiconductor device of claim 24,
the encapsulation body embeds the first power semiconductor chip and the second power semiconductor chip, and wherein the terminal portion has an external contact area exposed at the encapsulation body.

26. The semiconductor device of claim 24, wherein the semiconductor device is a DC-DC converter.

* * * * *